(12) United States Patent
Mazzola

(10) Patent No.: US 12,557,669 B2
(45) Date of Patent: Feb. 17, 2026

(54) METHOD OF MANUFACTURING SEMICONDUCTOR DEVICES, CORRESPONDING SUBSTRATE AND SEMICONDUCTOR DEVICE

(71) Applicant: STMicroelectronics S.r.l., Agrate Brianza (IT)

(72) Inventor: Mauro Mazzola, Calvenzano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 620 days.

(21) Appl. No.: 17/848,493

(22) Filed: Jun. 24, 2022

(65) Prior Publication Data

US 2023/0005825 A1    Jan. 5, 2023

(30) Foreign Application Priority Data

Jun. 30, 2021    (IT) .................. 102021000017189

(51) Int. Cl.
*H01L 23/495*    (2006.01)
*H01L 21/48*    (2006.01)
(Continued)

(52) U.S. Cl.
CPC .... *H01L 23/49548* (2013.01); *H01L 21/4828* (2013.01); *H01L 21/561* (2013.01); *H01L 23/3107* (2013.01); *H01L 23/49503* (2013.01)

(58) Field of Classification Search
CPC ........... H01L 23/49548; H01L 23/3107; H01L 23/49503; H01L 21/4828; H01L 21/561
See application file for complete search history.

(56) References Cited

U.S. PATENT DOCUMENTS

| 2003/0006492 A1 | 1/2003 | Ogasawara et al. |
| 2020/0035586 A1 | 1/2020 | Liong et al. |
| (Continued) | | |

FOREIGN PATENT DOCUMENTS

| CN | 101118891 A | 2/2008 |
| CN | 110783301 A | 2/2020 |
| (Continued) | | |

OTHER PUBLICATIONS

IT Search Report and Written Opinion for priority application, IT 10202100017189, report dated Mar. 11, 2022 (9 pgs.).

(Continued)

*Primary Examiner* — Timor Karimy
(74) *Attorney, Agent, or Firm* — Crowe & Dunlevy LLC

(57) ABSTRACT

Semiconductor chips to be singulated to individual semiconductor devices are arranged onto respective adjacent areas of a mounting substrate such as a pre-molded leadframe. The mounting substrate is made of a laminar, electrically conductive sculptured structure with molded electrically insulating material. Electrically conductive side formations in the adjacent areas of the mounting substrate include first and second pads at front and back surfaces, respectively, of the mounting substrate. The first contact pads at the front surface of the substrate include narrowed portions having side recesses. The second contact pads at the back surface of the substrate include widened portions having side extensions adjacent the side recesses. The electrically insulating material extends into the side recesses to provide anchoring formations of the insulating material to the electrically conductive sculptured structure of the mounting substrate.

15 Claims, 5 Drawing Sheets

(51) Int. Cl.
*H01L 21/56* (2006.01)
*H01L 23/31* (2006.01)

(56) References Cited

U.S. PATENT DOCUMENTS

2021/0183752 A1 6/2021 Derai et al.
2022/0270957 A1* 8/2022 Lau .................... H01L 23/3107

FOREIGN PATENT DOCUMENTS

| CN | 218867095 U | 4/2023 |
| EP | 1447847 A2 | 8/2004 |

OTHER PUBLICATIONS

CN First Office Action and Search Report for counterpart CN Appl. No. 202210769251.0, report dated Aug. 4, 2025, 11 pgs.

* cited by examiner

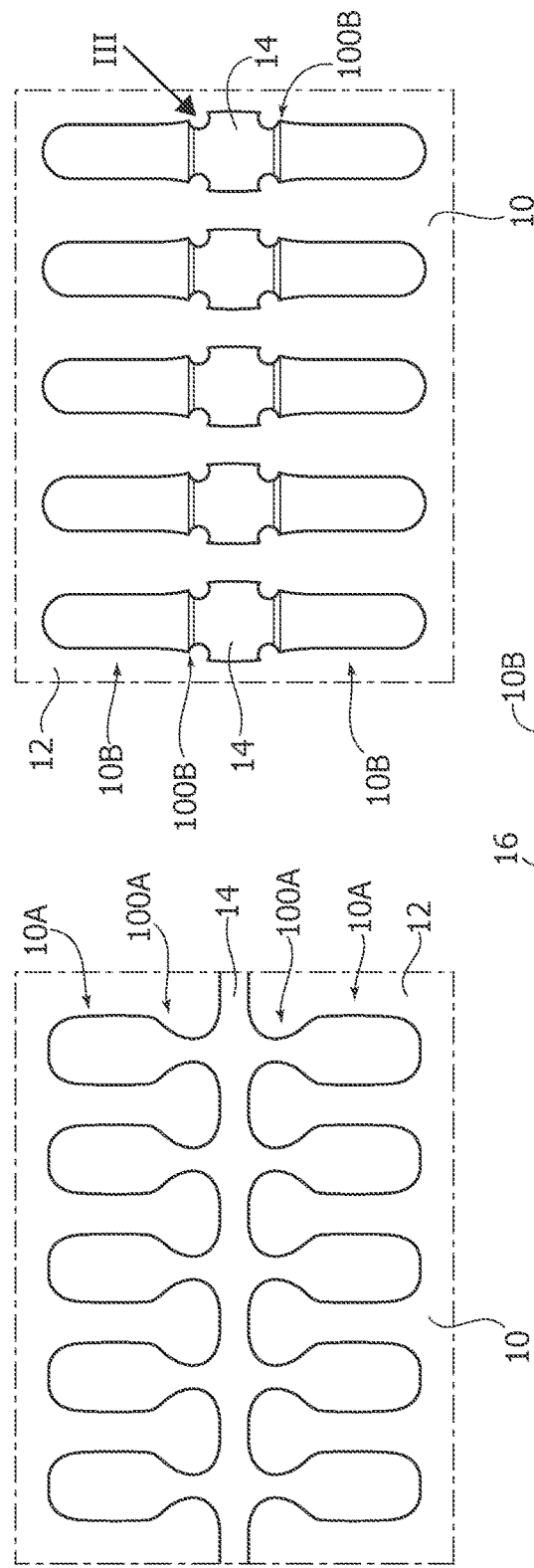
FIG. 2A
FIG. 2B
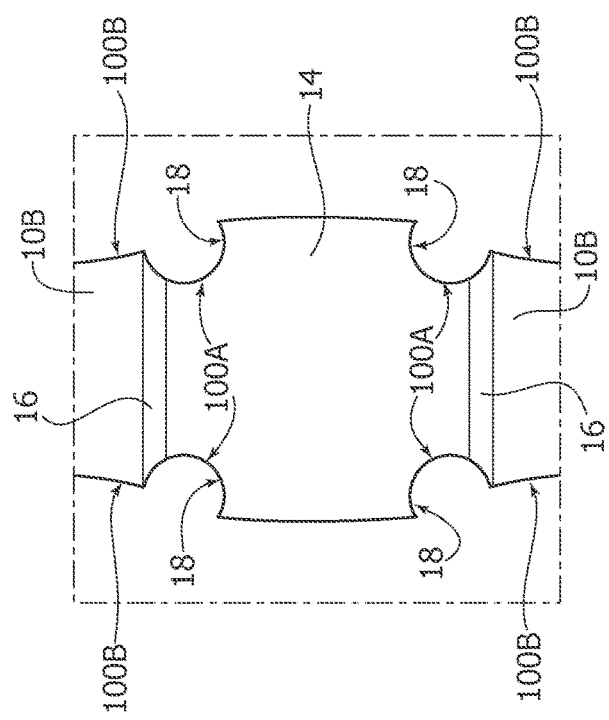
FIG. 3

METHOD OF MANUFACTURING SEMICONDUCTOR DEVICES, CORRESPONDING SUBSTRATE AND SEMICONDUCTOR DEVICE

PRIORITY CLAIM

This application claims the priority benefit of Italian Application for Patent No. 102021000017189, filed on Jun. 30, 2021, the content of which is hereby incorporated by reference in its entirety to the maximum extent allowable by law.

TECHNICAL FIELD

The description relates to semiconductor devices.

One or more embodiments may be applied, for instance, to semiconductor devices including a pre-molded leadframe.

One or more embodiments may be applied to semiconductor devices of the Quad-Flat No-lead (QFN) type.

BACKGROUND

A current approach in manufacturing semiconductor devices such as, for instance, Quad-Flat No-lead (QFN) package semiconductor devices, involves arranging (attaching) a plurality of semiconductor dice or chips onto a strip-like substrate such as a pre-molded leadframe.

Individual devices are formed in a final "singulation" step involving sawing the substrate having the semiconductor dice or chips arranged thereon and an insulating encapsulation molded thereon.

Mechanical load/vibrations produced during sawing can cause undesired delamination phenomena. Independently of or on top of that, thermal cycling (as deriving from assembly reflow or lifetime operation for power devices) can initiate delamination or worsen existing delamination conditions, which may lead to in-field device failure.

There is a need in the art to contribute to overcoming the drawbacks outlined in the foregoing.

SUMMARY

One or more embodiments may relate to a method.

One or more embodiments may relate to a corresponding component such as a pre-molded leadframe.

One or more embodiments may relate to a corresponding semiconductor device. A Quad-Flat No-lead (QFN) package may be exemplary of such a device.

One or more embodiments may provide a component in the form of a pre-molded leadframe for semiconductor devices where a modified half-etched layout of leads (pads) results in an anchoring shape for the leads which counters lead pull-out both in an "in-plane" direction and in a "vertical" direction.

One or more embodiments are compatible with the provision of wettable flanks for the leads.

One or more embodiments may contemplate shape modifications on the top side and the bottom side of electrically conductive pads such as leads.

In one or more embodiments, during leadframe formation (by etching, for instance) pad size is reduced on the top side in proximity of the package borderline with the bottom side exhibiting an area increased in size.

During pre-molding of the etched leadframe, pre-molding material (resin) fills open volumes thus created adjacent the pads. These volumes filled by pre-molding resin provide, once the resin is solidified, pillar structures which increase the resistance of pads to detachment by countering movement in the longitudinal direction, for instance.

The pads thus exhibit increased resistance to delamination and retain stable positions during sawing in the singulation step.

The possibility is maintained of creating wettable flanks, with a second etching on the bottom side, for instance.

BRIEF DESCRIPTION OF THE DRAWINGS

One or more embodiments will now be described, by way of example only, with reference to the annexed figures, wherein:

FIGS. 2A and 2B are a partial front view and a partial back view, respectively, of a leadframe modified according to embodiments of the present description prior to a singulation step;

FIG. 3 is an enlarged partial view of the portion of FIG. 2B indicated by arrow III;

DETAILED DESCRIPTION

Figure 1A:
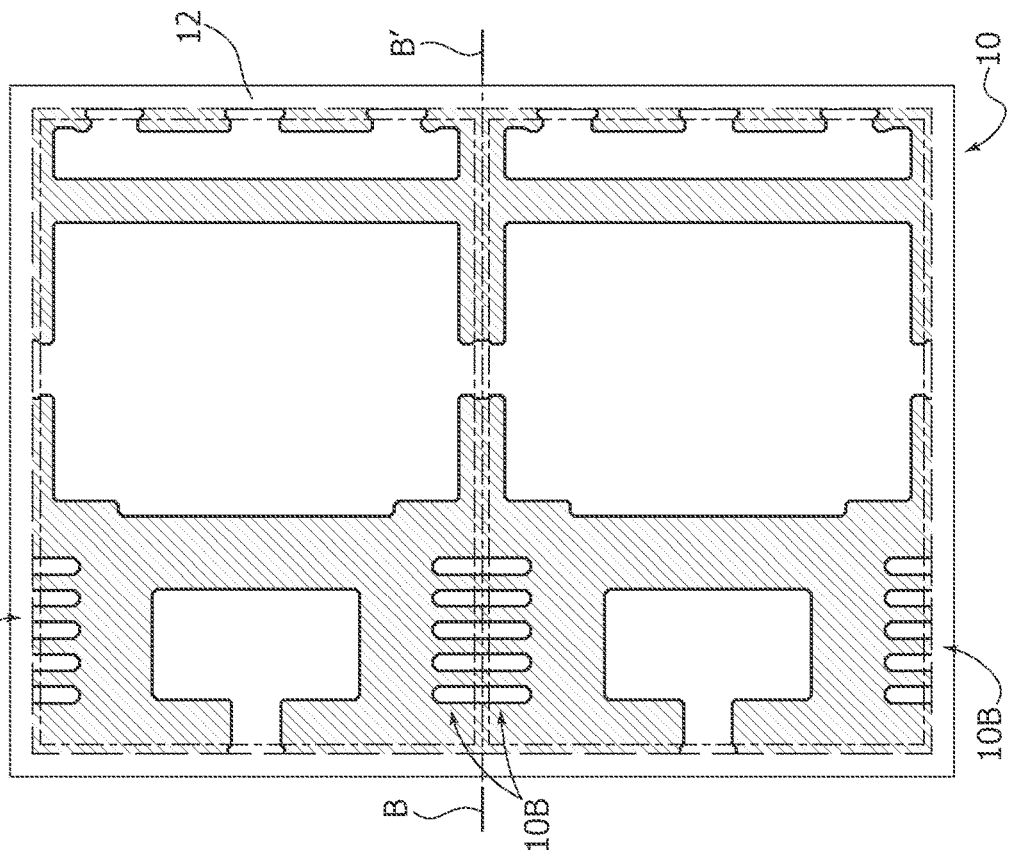
FIGS. 1A and 1B are plan views at the front (top) and back (bottom) level, respectively, of a conventional pre-molded leadframe.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

Semiconductor devices may comprise one or more semiconductor integrated circuit chips or dice arranged (attached) on substrates such as leadframes.

Plastic packages are commonly used for semiconductor devices. Such packages may include a leadframe providing a base substrate comprising electrically conductive material such as copper, sized and shaped to accommodate semiconductor chips or dice and providing pad connections (leads) for these chips or dice.

The designation "leadframe" (or "lead frame") is currently used (see, for instance the USPC Consolidated Glossary of the United States Patent and Trademark Office) to indicate a metal frame which provides support for an integrated circuit chip or die as well as electrical leads to interconnect the integrated circuit in the die or chip to other electrical components or contacts.

Leadframes are conventionally created using technologies such as a photo-etching technology. With this technology, metal (e.g., copper) material in the form of a foil or tape is etched on the top and bottom sides to create various pads and leads.

These technologies can be applied to a Quad-Flat No-leads (QFN) packages, where the designation "no-leads" denotes the fact that no leads are provided which protrude radially from the package.

So-called "pre-molded" leadframes are currently used which include electrically insulating resin such as epoxy resin, for instance, molded onto a sculptured (e.g., photo-etched) leadframe using a flat molding tool, for instance.

Spaces left in the etched metal material are filled by pre-molding resin and the resulting leadframe has a total thickness which is the same thickness of the original etched leadframe.

After pre-molding (with the molded resin solidified, via heat or UV curing, for instance), de-flashing and smearing processes can be applied to provide clean top/bottom metal surfaces.

Wettable flanks can be provided, e.g., during a second etching step which can be applied to the pre-molded leadframe to generate dedicated etched areas.

Figure 1B:
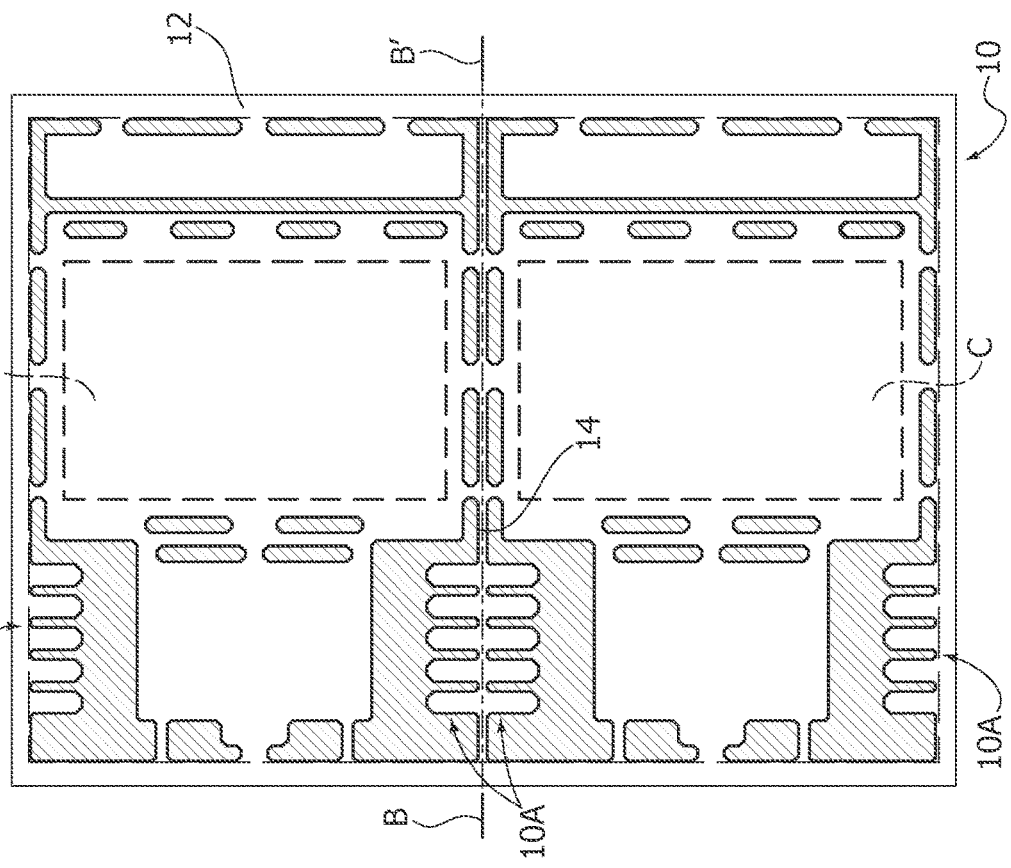

FIGS. 1A and 1B are plan views of the front (top) side and the back (bottom) side, respectively, of a portion of a pre-molded leadframe which is also referred to herein as a mounting substrate 10.

FIGS. 1A and 1B do indeed show two neighboring areas of a (pre-molded leadframe) mounting substrate 10 which are intended to be finally separated by sawing along a "singulation" line B-B' when forming individual semiconductor devices.

Current processes of manufacturing semiconductor devices involve processing simultaneously more than two such leadframe areas which are connected in a foil or strip and are intended to be finally "singulated" at plural cutting lines such as the line B-B'.

Two leadframe areas to be finally "singulated" by cutting at a single line B-B' are discussed here for simplicity.

Electrically-conductive pads (leads) are shown formed at the front or top side (as indicated by 10A) and the back or bottom side (as indicated by 10B) of the mounting substrate 10.

As illustrated, the pads designated 10A, 10B are at a peripheral location with respect to one or more die pads (only one is illustrated for simplicity) where a semiconductor chip or die C is intended to be arranged (attached) at the front or top side of the mounting substrate 10 as shown in dashed lines for the two leadframe areas illustrated in FIG. 1A.

In a pre-molded leadframe mounting substrate 10 as illustrated in the figures the top-side pads 10A and the bottom-side pads 10B are arranged in pairs of opposed pads which are part of a same electrically conductive formation of the mounting substrate 10. It is noted that such an arrangement, referred to for simplicity throughout this exemplary description, is not mandatory.

The leadframe areas illustrated in FIGS. 1A and 1B are thus exemplary of a mounting substrate 10 configured to have a plurality of semiconductor chips C arranged onto respective adjacent areas.

These (two or more) adjacent areas have mutually facing sides (see, for instance, the sides extending at the cutting line B-B' in FIGS. 1A and 1B) wherein the mounting substrate comprises a laminar, electrically conductive sculptured (e.g., etched) structure and electrically insulating material (an epoxy resin, for instance) 12 molded onto the sculptured structure.

The electrically conductive sculptured structure of the mounting substrate 10 (comprising etched metal material such as copper, for instance) includes electrically conductive side formations of the adjacent areas of the mounting substrate 10 so that adjacent areas of the mounting substrate 10 have mutually facing electrically conductive side formations, namely the pads 10A, 10B.

Consequently, the electrically conductive side formations (the pads 10A, 10B) of one of the adjacent areas of the mounting substrate are arranged facing electrically conductive side formations (again, respective pads 10A, 10B) in another of the adjacent areas of the mounting substrate.

As visible in FIGS. 1A and 1B, the mounting substrate 10 has a front or top surface (FIG. 1A) and a back or bottom surface (FIG. 1B) and the electrically conductive side formations of the adjacent areas of the mounting substrate comprise first contact pads 10A and second contact pads 10B at the front surface and at the back surface, respectively, of the mounting substrate 10.

As discussed, the mounting substrate 10 is configured to be cut at mutually facing sides of the adjacent areas (along line B-B', for instance) and the mutually facing electrically conductive side formations, namely the pads 10A, 10B of adjacent areas of the mounting substrate are separated as a result of cutting.

As illustrated in FIGS. 1A and 1B, the side pads 10A at the front or top surface are wider and connected via a connecting bar 14 which is half-etched in the mounting substrate 10 and intended to be removed as a result of cutting (e.g., along the line B-B') during a final singulation step to create individual semiconductor devices.

The side pads 10B on the back or bottom side are usually smaller, sized and dimensioned in view of mounting on a support substrate such a printed circuit board or PCB (not visible in the figures).

Pads such as those indicated at 10A and 10B in FIGS. 1A and 1B have a substantially rectangular shape with a (minimal) etching radius at the corners. It is noted that such a shape is not mandatory.

In packages where wettable flanks are provided, a second etching can be applied to the pre-molded leadframe mounting substrate 10 to remove copper to a depth on the back or bottom side of the mounting substrate 10.

Unless indicated otherwise in the following, the foregoing is conventional in the art, which makes it unnecessary to provide a more detailed description herein.

As noted, after die attachment, wire bonding and package molding, the individual packages are separated in a singulation step using a disc sawing machine, for instance.

That is, the mounting substrate 10 having a plurality of semiconductor chips C arranged thereon is cut at the mutually facing sides of the adjacent areas (e.g., along lines such as B-B') to provide individual singulated semiconductor devices.

In that way, the mutually facing, electrically conductive side formations (that is the pads 10A, 10B) of adjacent areas of the mounting substrate 10 are separated as a result of cutting (for instance, a disc blade cuts away the material between packages singulating the units of the final packages).

The electrically conductive sculptured structure of the mounting substrate 10 comprises connecting bars such as 14 between the contact pads 10A of adjacent areas of the mounting substrate at the front surface of the mounting substrate.

These connecting bars such as 14 are removed as a result of cutting the mounting substrate 10 having a plurality of semiconductor chips C arranged thereon at the mutually facing sides of adjacent areas.

Again, such processing is conventional in the art.

A problem likely to arise during singulation is that stresses and vibrations resulting from cutting may adversely affect adhesion of the pads or leads to the resin (this applies both to the pre-molding resin 12 of the mounting substrate 10 and also to the final encapsulation molded onto the mounting substrate 10 after attaching semiconductor chips thereon).

The pads (or leads; as used herein, the designation pads will cover both) should desirably stay in an exact position with respect to the package body over all the processing phases discussed in the foregoing, without undergoing detachment (so-called delamination) due to poor adhesion.

An approach proposed so far in order to address these issues includes increasing the roughness of the surfaces of the pads.

Applying oxided side walls during leadframe manufacturing on the lateral sides of the pads has also been experimented.

Both approaches were found to provide relatively small improvements in resistance to detachment, while undesirably adding to process time and cost.

One or more embodiments as discussed herein involve differentiating the shapes of contact pads such as 10A and 10B as provided on the front or top side and on the back or bottom side of the (pre-molded) leadframe mounting substrate 10.

As exemplified in FIG. 2A, the pads 10A at the front or top side of the mounting substrate 10 are formed—during etching, for instance—with narrowed portions 100A adjacent the connecting bar 14 (and thus adjacent the cutting line B-B') as illustrated in FIG. 2A.

Figure 4:
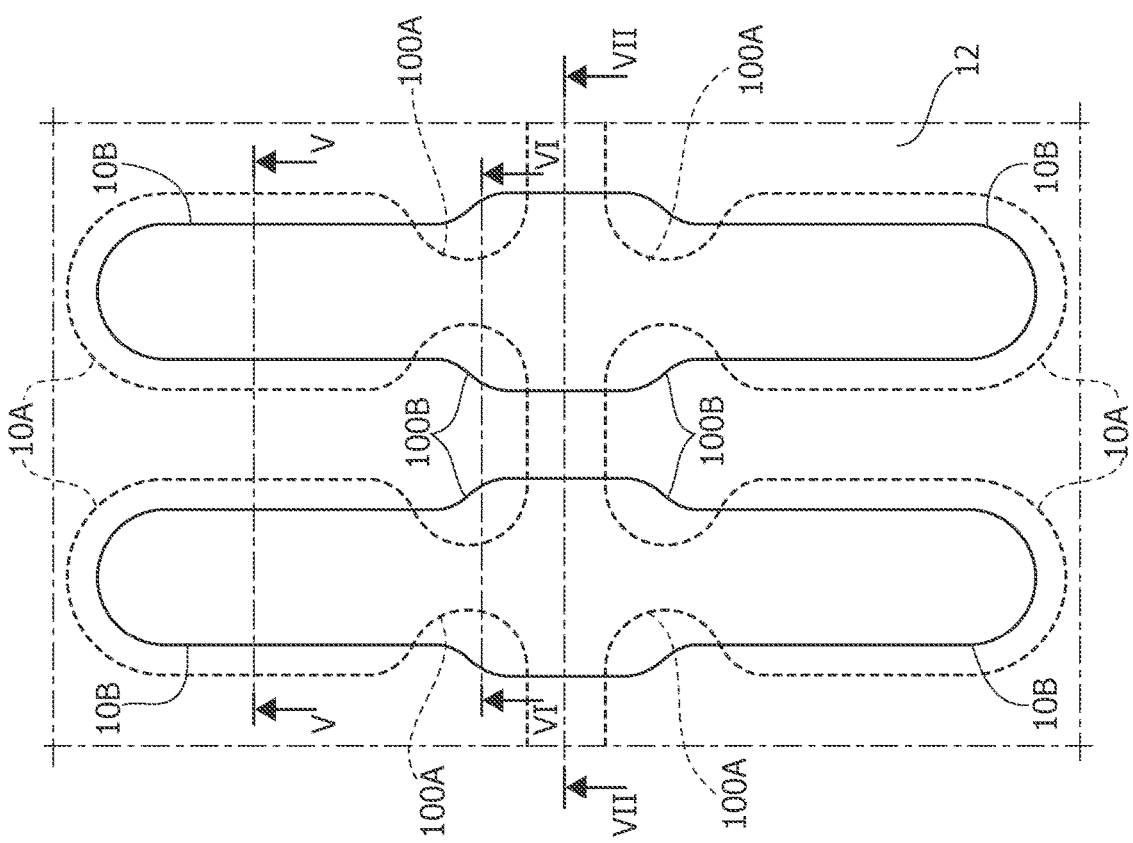
FIG. 4 is a shadow-line representation of pads according to embodiments of the present description prior to a singulation step.

For instance, as illustrated in FIGS. 2A and 4, the contact pads 10A may be formed with a shape which can be approximately likened to an hourglass shape (wider towards the distal end of each pad, narrowing at the portions 100A and widening again at the proximal end at the connecting bar 14).

Conversely, as illustrated in FIGS. 2B and 4, for instance, the pads 10B at the back or bottom side are formed—again during etching, for instance—with (slightly) enlarged portions 100B adjacent the connecting bar 14.

For instance, as better appreciated in FIG. 4, the contact pads 10B may be formed with a shape exhibiting an intermediate bulged portion, that is an intermediate swelling or protruding portion at the location of the connecting bar 14.

Figure 5:
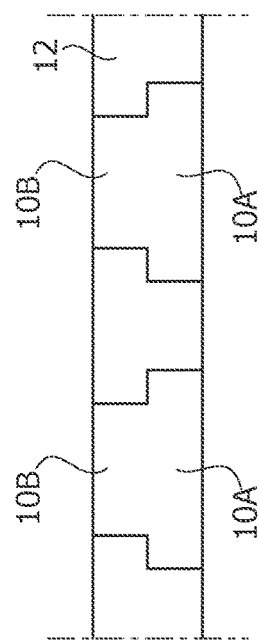
FIGS. 5, 6 and 7 are cross-sectional views according to lines V-V, VI-VI, and VII-VII, respectively, in FIG. 4.
Figure 6:
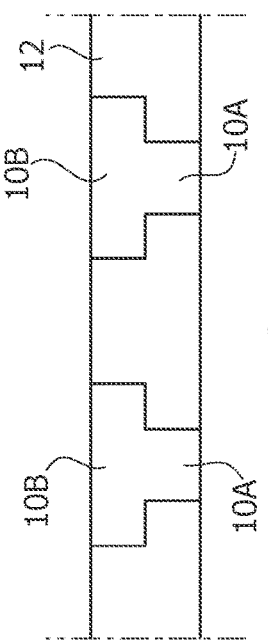

As noted, each pair of a front or top side pad 10A and a back or bottom side pad 10B as illustrated herein are assumed for simplicity to be part of a same electrically conductive formation as visible in the cross-sectional views of FIGS. 5 and 6.

These figures are cross sectional views along lines V-V and Vi-VI of FIG. 4 which—like FIG. 2B—is a plan view from the back or bottom side of the mounting substrate 10.

That is, in the cross-sectional views of FIGS. 5 and 6 the front or top pads 10A and the back or bottom pads 10B are illustrated facing downwards and upwards, respectively.

As illustrated herein, the electrically conductive formations comprising the pads 10A and 10B have a T-shaped (or mushroom-like) cross-section which:

in the body portions of the formations (away from the connection bar 14 and the cutting line B-B'—see FIG. 5) is an inverted-T cross section with the pads 10A at the front or top surface (facing downwards in FIGS. 5 and 6) larger than the pads 10B at the back or bottom surface (facing upwards in FIGS. 5 and 6); and in the portions located near the connection bar 14 and the cutting line B-B'—see FIG. 6) is an upright-T cross section with the pads 10A at the front or top surface (facing downwards in FIGS. 5 and 6) narrower than the pads 10B at the back or bottom surface (facing upwards in FIGS. 5 and 6).

Figure 7:
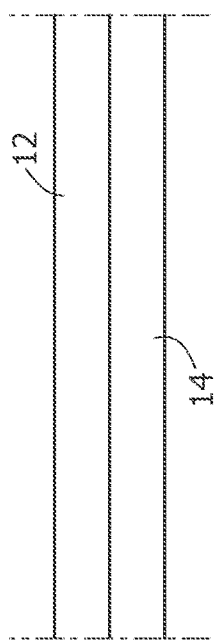

FIG. 7 is a longitudinal cross-section along line VII-VII of FIG. 4 through the connecting bar 14 which has a constant cross-section with a height approximately half the height or thickness of the mounting substrate 10: this may result from (further) etching of the leadframe metal material to create (in a manner known per se to those of skill in the art) wettable flanks 16 (see FIG. 3) intended to facilitate soldering the final semiconductor packages on a support substrate such as a printed circuit board or PCB.

The shaping of the pads 10A, 10B exemplified in FIGS. 2A, 2B and 3 to 6 facilitates creating at the narrowed neck portions 100A of the pads 10A open volumes which are filled by the pre-molding resin 12 during leadframe pre-molding as visible from the back or bottom side as illustrated in FIGS. 2B and 3 (where the connecting bar 14 is clearly visible due to removal of material superposed thereto during the (further) etching step leading to the formation of the wettable flanks 16.

As a result, the pre-molding resin 12 penetrated (and solidified, via heat or UV curing, for instance) in these spaces forms "pillar" structures 18, also referred to herein as anchoring formations, which extend to a certain depth or height of the leadframe and provide a retaining "locking" structure of the pads 10A, 10B with respect to the pre-molding resin 12.

The solution described herein thus comprises shaping the electrically conductive side formations as represented by the pads 10A, 10B in adjacent areas of the mounting substrate to form the contact pads 10A at the front surface of the substrate 10 with (intermediate) narrowed portions 100A having side recesses, wherein the electrically insulating material 12 molded onto the sculptured structure of the mounting substrate 10 penetrates into these side recesses and creates (in response to being solidified, via heat or UV curing, for instance) formations, such as the "pillars" 18, for instance, that anchor the insulating material 12 to the electrically conductive sculptured structure of the mounting substrate represented by the mounting substrate 10.

The pillars 18 are beneficial in so far as they increase the resistance of the contact pads 10A, 10B to detachment (delamination), countering undesired movement of these pads 10A, 10B with respect to the pre-molding resin 12, primarily in the longitudinal direction of the pads 10A, 10B.

Figure 8:
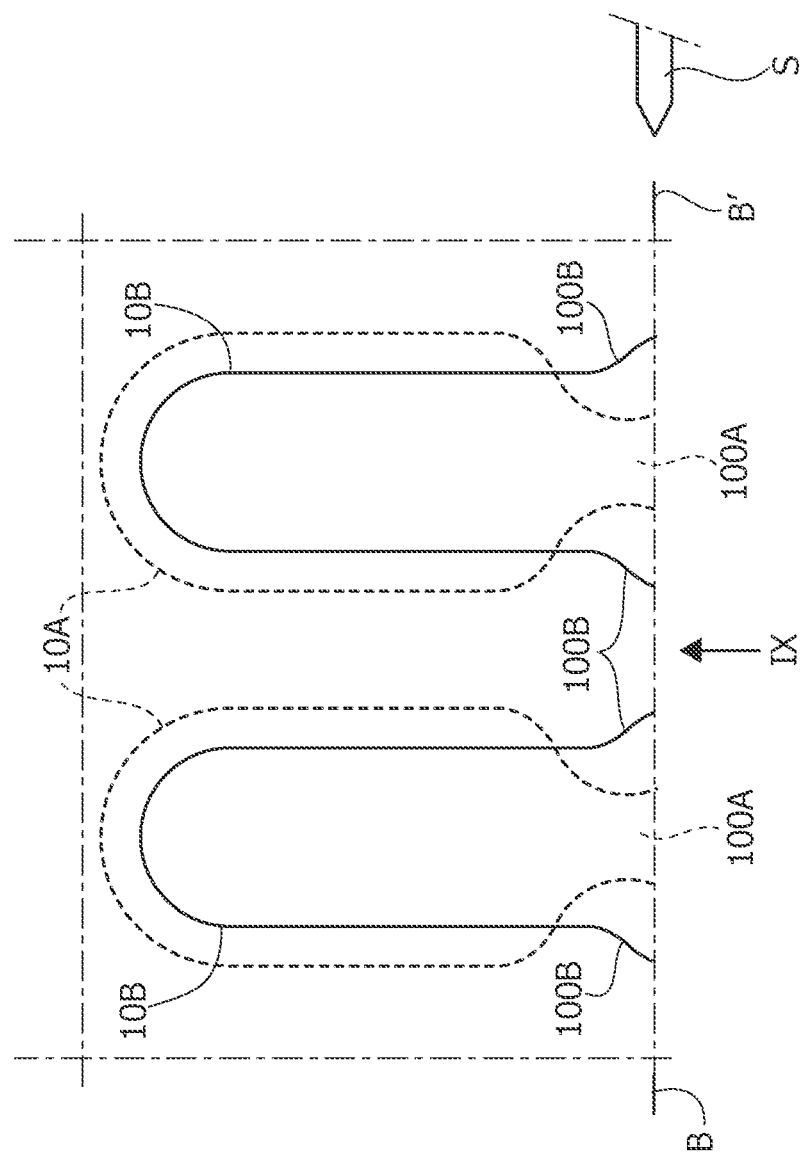
FIG. 8 is a shadow-line presentation of pads as per embodiments of the present description after a singulation step.
Figure 9:
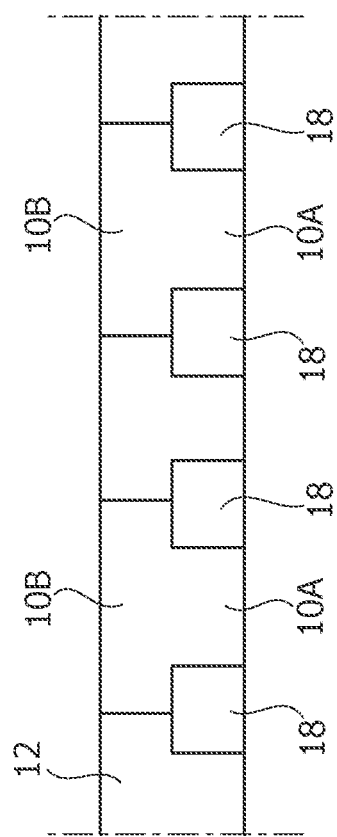
FIG. 9 is a side elevational view along line IX of FIG. 8.

The pads 10A, 10B thus exhibit increased resistance to delamination and maintain stable positions as desired during the singulation cutting step along line B-B' as schematically represented by a blade S in FIG. 8.

Advantageously, the contact pads 10B at the back surface of the mounting substrate 10 are provided with enlarged "bulging" (intermediate) portions 100B having side extensions adjacent the side recesses in the narrowed "necked" portions 100A the contact pads 10A at the front surface of the mounting substrate 10.

This was found to create in the vicinity of the "pillars" 18 a shaped metal-resin interface beneficial in increasing resistance of pads 10A, 10B to detachment (delamination).

Solutions as described herein are compatible with conventional methods of manufacturing pre-molded leadframes, e.g.: providing a laminar structure of an electrically conductive material such as copper; and selectively removing electrically conductive material from the laminar structure to provide an electrically conductive sculptured structure with electrically conductive side formations such as 10A, 10B in adjacent areas of a mounting substrate 10 having first 10A and second 10B contact pads at the front surface and the back surface, respectively.

Solutions as described herein are likewise compatible with conventional methods of providing so-called wettable flanks to facilitate soldering by, e.g., selectively removing electrically conductive material from the laminar structure of a leadframe at the electrically conductive side formations providing the pads 10A, 10B to provide wettable end flanks at the back surface of the mounting substrate 10.

Selectively removing electrically conductive material from the laminar structure of the leadframe may be via selective etching as otherwise conventional in the art.

A mounting substrate 10 as discussed herein can be produced by a supplier as a stand-alone product (component) and supplied to a manufacturer of semiconductor devices in view of manufacturing semiconductor devices with one or more semiconductor chips C mounted on such a mounting substrate comprising a laminar, electrically conductive sculptured structure and electrically insulating material 12 molded onto the sculptured structure of the substrate 10.

As can be appreciated, e.g., from FIG. 8, in the individual semiconductor devices resulting from singulation, the (first) contact pads 10A at the front surface of the substrate 10 will comprise narrowed (tapered) end portions 100A between side recesses.

The electrically insulating material 12 molded onto the sculptured structure of the leadframe and thus penetrated into these side recesses provides (in response to being solidified, via heat or UV curing, for instance) anchoring formations 18 of the insulating material 12 to the electrically conductive sculptured structure of the mounting substrate 10.

Advantageously, the anchoring effect can be further enhanced by the (second) contact pads 10B at the back surface of the substrate 10 comprising enlarged end portions 100B having side extensions adjacent the side recesses in the narrowed (tapered) end portions 100A of the contact pads 10A at the front surface of the substrate.

Figures 10, 11:
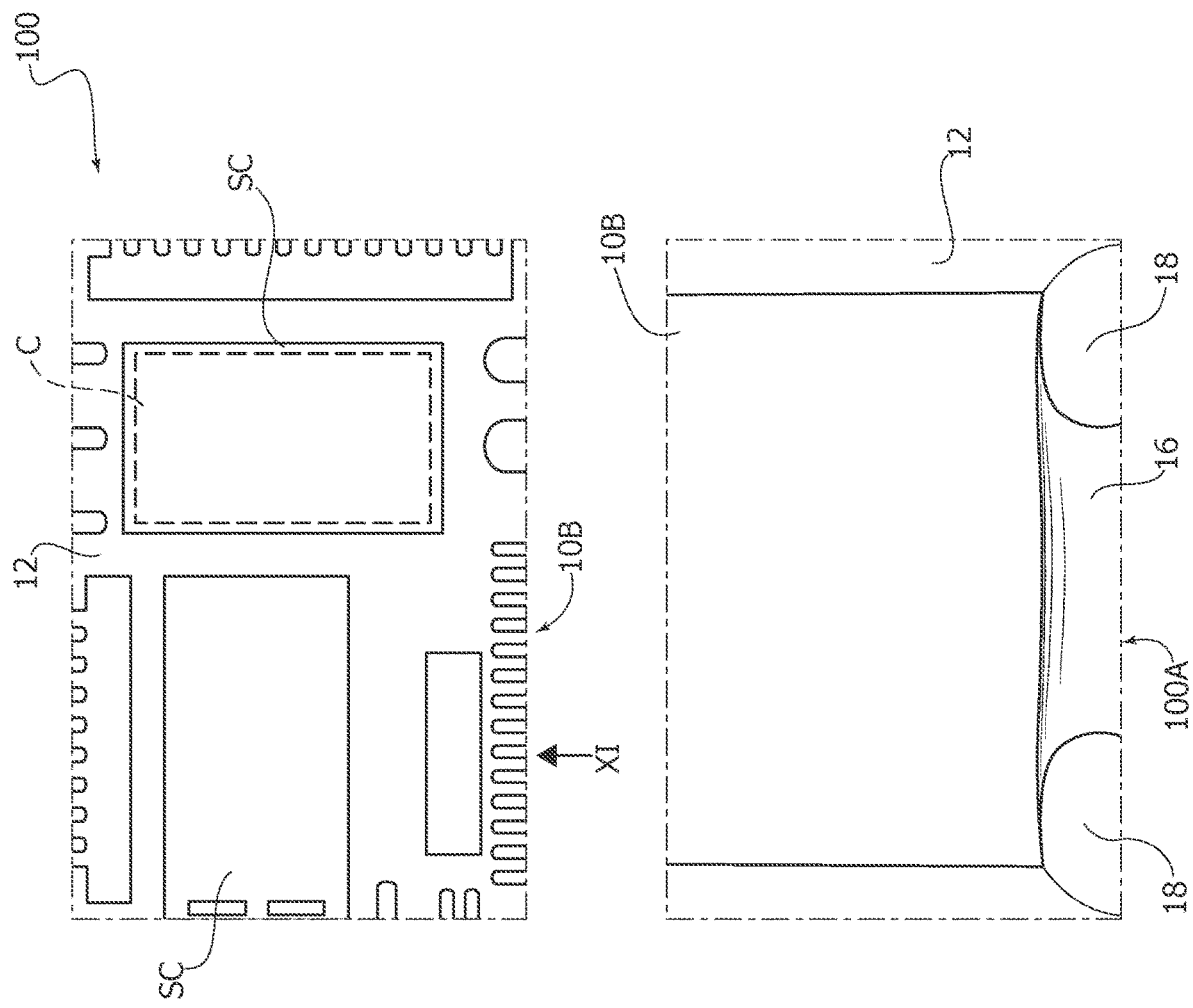
FIG. 10 is a plan view of a semiconductor device according to embodiments of the present description.
FIG. 11 is a view of the portion indicated by arrow XI in FIG. 10 represented on an enlarged scale.

FIG. 10 is an exemplary plan view (from the back or bottom surface) of a semiconductor device 100, such as a power QFN device for instance, which can be manufactured with the method discussed herein.

In FIG. 10 (and FIG. 11) the pads 10B at the back or bottom surface are visible with the resin 12 penetrating into the spaces or volumes formed at the narrowed (tapered) ends 100A of the pads 10A at the front or top surface to provide the pillar structures 18.

These formations safely retain the pads 10A, 10B in place while countering delamination from the pre-molding resin 12.

Die mounting pads, designated SC, where one or more semiconductor chips or dice C are mounted (at the front or top portion of the leadframe—as indicated by dashed lines) are also visible in FIG. 10.

The semiconductor device 100 illustrated in FIG. 10 thus comprises one or more semiconductor chips C mounted on respective portions (see, e.g., the pads SC) of the front surface of a substrate 10.

The substrate has a back surface opposite the front surface and comprises a laminar, electrically conductive sculptured structure and electrically insulating material 12 molded onto the electrically conductive sculptured structure.

The electrically conductive sculptured structure comprises first 10A and second 10B contact pads at the front surface and the back surface of the substrate 10, respectively.

The first contact pads 10A at the front surface of the substrate have narrowed (tapered) end portions 100A (see FIG. 8) having side recesses with the electrically insulating material 12 molded onto the electrically conductive sculptured structure of the substrate 10 penetrated into these side recesses.

As a result of being solidified the material 12 provides anchoring formations 18 to the electrically conductive sculptured structure of said mounting substrate 10.

Advantageously, the second contact pads 10B at the back surface of the substrate 10 have enlarged end portions 100B with side extensions adjacent the side recesses in the narrowed (tapered) end portions 100A of the first contact pads 10A at the front surface of the substrate.

Wettable flanks 16 of the second pads (10B) can be provided at the back surface of the mounting substrate 10 as illustrated in FIG. 11.

Without prejudice to the underlying principles, the details and embodiments may vary, even significantly, with respect to what has been described by way of example only without departing from the extent of protection.

The claims are an integral part of the teaching provided herein in respect of the embodiments.

The extent of protection is defined by the annexed claims.

The invention claimed is:

1. An apparatus, comprising:
a mounting substrate including an electrically conductive sculptured structure having a front surface and a back surface, wherein adjacent areas of the mounting substrate have mutually facing electrically conductive side formations connected to each other by a connecting bar, each electrically conductive side formation including a first contact pad at the front surface and a second contact pad at the back surface;
wherein the mounting substrate is configured to be cut between said adjacent areas at said connecting bar;
wherein each first contact pad at the front surface has a first width measured perpendicular to a length of the first contact pad, where said first width narrows from a distal end of the electrically conductive side formation to said connecting bar; and wherein each second contact pad at the back surface has a second width measured perpendicular to the length of the second contact pad, where said second width widens from the distal end of the electrically conductive side formation to said connecting bar.

2. The apparatus of claim 1, wherein the first width of the first contact pad at a location adjacent said connecting bar is smaller than the second width of the second contact pad at the location adjacent said connecting bar.

3. The apparatus of claim 1, wherein the first width of each first contact pad at the front surface at a location adjacent said connecting bar forms side recesses at portions of the second contact pad at the back surface that have the second width at the location adjacent said connecting bar.

4. The apparatus of claim 3, further comprising an electrically insulating material molded onto the electrically conductive sculptured structure and filling said side recesses.

5. The apparatus of claim 1, further comprising a thinned portion at the back surface of the electrically conductive sculptured structure at said connecting bar providing wettable flanks for said second pads.

6. A semiconductor device, comprising:
a mounting substrate including an electrically conductive sculptured structure having a front surface and a back surface and further having electrically conductive side formations, each electrically conductive side formation including a first contact pad at the front surface and a second contact pad at the back surface;
wherein each first contact pad at the front surface has a first width measured perpendicular to a length of the first contact pad, where said first width narrows from a distal end of the electrically conductive side formation to a cut end of the electrically conductive side formation;
wherein each second contact pad at the back surface has a second width measured perpendicular to a length of the second contact pad, where said second width widens from the distal end of the electrically conductive side formation to the cut end of the electrically conductive side formation;
an integrated circuit chip mounted to the front surface of the mounting substrate; and
an electrically insulating material which insulates between electrically conductive side formations.

7. The semiconductor device of claim 6, wherein the first width of the first contact pad adjacent said cut end of the electrically conductive side formation is smaller than the second width of the second contact pad adjacent said cut end of the electrically conductive side formation.

8. The semiconductor device of claim 6, wherein the narrowed first width of each first contact pad at the front surface adjacent said cut end of the electrically conductive side formation forms side recesses at portions of the second contact pad at the back surface that have the widened second width adjacent said cut end of the electrically conductive side formation.

9. The semiconductor device of claim 8, wherein said electrically insulating material fills said side recesses.

10. The semiconductor device of claim 6, further comprising a thinned portion at the back surface of the electrically conductive sculptured structure at said cut end of the electrically conductive side formation providing wettable flanks for said second pads.

11. A mounting substrate configured to have a plurality of semiconductor chips arranged onto respective adjacent areas thereof, said adjacent areas having mutually facing sides, wherein the mounting substrate comprises a laminar, electrically conductive sculptured structure and electrically insulating material molded onto the electrically conductive sculptured structure, the electrically conductive sculptured structure comprising electrically conductive side formations of said adjacent areas of the mounting substrate, wherein adjacent areas of the mounting substrate have mutually facing electrically conductive side formations with electrically conductive side formations of one of said adjacent areas of the mounting substrate facing electrically conductive side formations in another of said adjacent areas of the mounting substrate, wherein the mounting substrate has a front surface and a back surface and said electrically conductive side formations of said adjacent areas of the mounting substrate comprise first and second contact pads at the front surface and the back surface, respectively, of the mounting substrate;
wherein the mounting substrate configured to have said plurality of semiconductor chips arranged thereon is configured to be cut at said mutually facing sides of said adjacent areas to provide individual singulated semiconductor devices, wherein said mutually facing electrically conductive side formations of adjacent areas of the mounting substrate are separated as a result of said cutting; and
wherein said electrically conductive side formations in adjacent areas of the mounting substrate comprise:
said first contact pads at the front surface of the mounting substrate having narrowed portions with side recesses at said mutually facing sides, and
said second contact pads at the back surface of the mounting substrate having enlarged portions having side extensions at said mutually facing sides adjacent said side recesses in the narrowed portions of said contact pads at the front surface of the mounting substrate,
with the electrically insulating material molded onto the electrically conductive sculptured structure of the mounting substrate penetrated into said side recesses providing anchoring formations of the electrically insulating material to the electrically conductive sculptured structure of said mounting substrate.

12. The mounting substrate of claim 11, further comprising wettable flanks of said second contact pads at the back surface of the mounting substrate.

13. The mounting substrate of claim 11, wherein the electrically conductive sculptured structure comprises connecting bars between the contact pads at the front surface of the mounting substrate of said mutually facing electrically conductive side formations of adjacent areas of the mounting substrate, wherein said connecting bars are configured to be removed as a result of said cutting the mounting substrate having said plurality of semiconductor chips arranged thereon at said mutually facing sides of said adjacent areas.

14. A semiconductor device, comprising:
at least one semiconductor chip mounted on a front surface of a substrate, the substrate having a back surface opposite the front surface and comprising a laminar, electrically conductive sculptured structure and electrically insulating material molded onto the electrically conductive sculptured structure, the electrically conductive sculptured structure comprising first and second contact pads at the front surface and the back surface of the substrate, respectively; and
wherein said first contact pads at the front surface of the substrate have narrowed end portions having side recesses with the electrically insulating material molded onto the electrically conductive sculptured structure of the substrate penetrated into said side recesses and providing anchoring formations of the electrically insulating material to the electrically conductive sculptured structure of said substrate; and wherein said second contact pads at the back surface of the substrate have enlarged end portions with side extensions adjacent said side recesses in the narrowed end portions of said first contact pads at the front surface of the substrate.

15. The semiconductor device of claim 14, further comprising wettable flanks of said second pads at the back surface of the substrate.

\* \* \* \* \*